United States Patent [19]
Mueller et al.

[11] 4,339,668
[45] Jul. 13, 1982

[54] MONOLITHICALLY INTEGRATED CIRCUIT OF HIGH DIELECTRIC STRENGTH FOR ELECTRICALLY COUPLING ISOLATED CIRCUITS

[75] Inventors: Ruediger Mueller, Munich; Michael Pomper, Schliersee; Ludwig Leipold, Munich, all of Fed. Rep. of Germany

[73] Assignee: Siemens Aktiengesellschaft, Berlin & Munich, Fed. Rep. of Germany

[21] Appl. No.: 75,679

[22] Filed: Sep. 14, 1979

[30] Foreign Application Priority Data

Sep. 28, 1978 [DE] Fed. Rep. of Germany ....... 2842319

[51] Int. Cl.³ .............................................. H01L 27/12
[52] U.S. Cl. ..................................... 307/149; 357/49; 333/24 C
[58] Field of Search ................. 307/98, 149, 150, 151, 307/152, 153, 154, 155, 156, 157; 357/47, 49, 51; 333/24 C, 165; 361/400

[56] References Cited
U.S. PATENT DOCUMENTS 3,519,901 7/1970 Bean et al. ........................ 357/51 X
4,125,818 11/1978 Haken et al. ..................... 307/293 X

OTHER PUBLICATIONS

"Single-Transistor Cell makes room for more memory on an MOS Chip", Cohen et al.
"Kapazitiver Triac-Koppler", Elektor Jul./Aug. 1976, (Article 31).
"Halbleiterbauelemente für die Elektronik", Siemens.
"Silicon-on-Sapphire substrates overcome MOS Limitations", A. Rapp et al.
"Capacitors of Coplanar Microstrip Lines in Integrated Circuits", H. Fritzche, 1976.

Primary Examiner—Michael L. Gellner
Assistant Examiner—James L. Dwyer
Attorney, Agent, or Firm—Hill, Van Santen, Steadman, Chiara & Simpson

[57] ABSTRACT

A system is disclosed for coupling electrically isolated circuits in a monolithic integrated circuit. A signal coupler is integrated on a chip together with a primary circuit and a secondary circuit which is to be coupled to the primary circuit. The signal coupler comprises an integrated coupling capacitor which consists of a coplanar conductor path arrangement embedded into a passivation layer, the passivation layer being applied to an insulating substrate, preferably sapphire.

11 Claims, 9 Drawing Figures

$C_{K1n} = C_{1n}$ $a^* = (n-1)a' + (n-2) \cdot w$

MONOLITHICALLY INTEGRATED CIRCUIT OF HIGH DIELECTRIC STRENGTH FOR ELECTRICALLY COUPLING ISOLATED CIRCUITS

BACKGROUND OF THE INVENTION

The invention relates to a monolithically integrated circuit of high dielectric strength for electrically coupling isolated circuits.

In most cases circuits operated directly from the mains require electrical decoupling between the input side and the output side with high dielectric strength, e.g. 1.5 kV voltage difference between the two sides. Previously circuits of this kind have been constructed exclusively from discrete components, such as for example transformers, capacitors or opto-couplers. Known semiconductor relays are constructed for example with hybrid-integrated components in which case an opto-coupler consists of a photo-diode, a light conducting path, and a photo-transistor. The use of a capacitor for the aforementioned purpose is disclosed for example in the magazine "Elektor", July/August 1976, 7-48/49 "Kapazitiver Triac-Keppler".

One of the disadvantages of the known circuits is that they are relatively complicated and are also expensive.

SUMMARY OF THE INVENTION

An object of the present invention is to provide a circuit which combines the advantages of high dielectric strength in the path between input side and output side, a small space requirement, and low production costs.

The object on which the invention is based is attained by a monolithically integrated circuit of high dielectric strength for electrically coupling isolated circuits. A signal coupler is integrated on a chip together with a primary circuit and a secondary circuit which is to be coupled to the primary circuit. The signal coupler comprises an integrated coupling capacitor which consists of a plurality of sub-capacitors formed of a coplanar arrangement of more than two conductors and is embedded into a passivation layer and is applied to an insulating substrate which preferably consists of sapphire.

A coplanar conductor path arrangement of only two conductors is known from the "Siemens Forschungs- und Entwicklungsberichten", see Vol. 5 (1976) No. 2, page 72-75, H. Fritzsche: "Capacitances of Coplanar Microstrip Lines in Integrated Circuits", incorporated herein by reference.

The invention offers the advantage that a relatively high dielectric strength can be achieved which, when solid silicon techniques are used, can otherwise only be reproduced with extreme difficulty. A further advantage consists in that the monolithically integrated circuit corresponding to the invention is small in volume and can be produced with favorable cost.

A further development of the invention is that a plurality of coupling sub-capacitors each consisting of coplanar conductor path arrangements are arranged on the chip. The coupling sub-capacitors are commonly interconnected in a series arrangement to form a capacitive voltage divider. The intervals between the conductor paths are reduced in comparison to the intervals between the conductor paths in the case of a coupling capacitor consisting of one single coplanar conductor path arrangement. The sub-capacitors are also created with a precise symmetrical design when integrated.

A further development of the invention offers the advantage that the dielectric strength of the path between the input and the output of the overall circuit can be increased.

DESCRIPTION OF THE PREFERRED EMBODIMENTS

Figure 1:
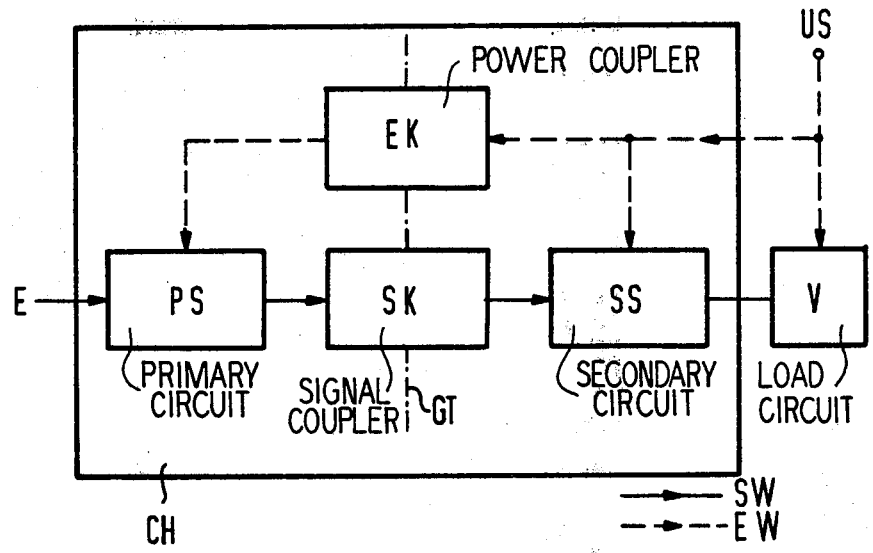
FIG. 1 is the block circuit diagram of an integrated solid body relay which is designed in accordance with the invention and the individual circuit zones of which are arranged in integrated fashion on one single chip.

As already mentioned, FIG. 1 is a simplified block circuit diagram of a switch which is monolithically integrated on a chip CH, and which is to switch a load external to the chip at the secondary side and contains electrical isolation means GT (solid body relay). If the primary circuit PS is to be supplied from the secondary side, in addition to a signal coupler SK which influences the secondary circuit SS, an energy transmission circuit, i.e. a power coupler EK arranged on the chip and designed substantially the same as the signal coupler SK, is also required. The signal path is referenced SW whereas the power supply path is referenced EW.

Figure 2:
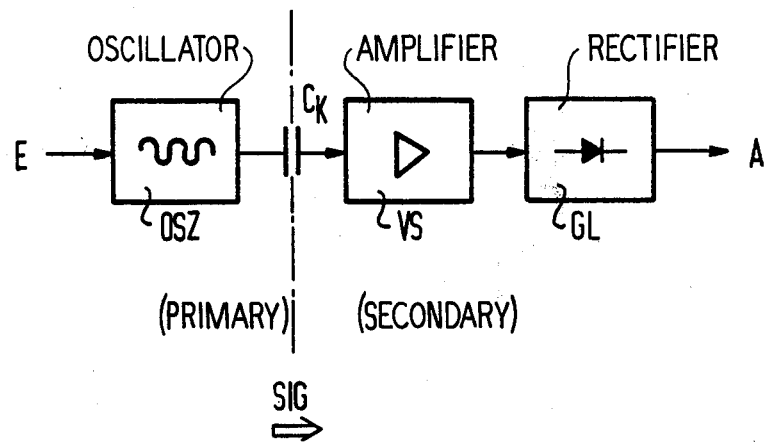
FIG. 2 is the block circuit diagram of an integrated capacitive coupler for signal transmission which is designed in accordance with the invention.

As already mentioned, FIG. 2 is the block circuit diagram of a circuit for a capacitive signal coupler. At the primary side P a high-frequency signal is produced by an oscillator OSZ (which is controlled by the signal input E arriving external to the chip) transmitted via the coupling capacitor $C_K$ to the secondary side S, where it is amplified and preferably rectified (output signal A).

Figure 3:
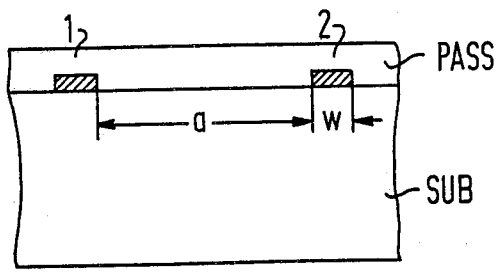
FIG. 3 is a cross-sectional view of a portion of a circuit constructed in accordance with the invention illustrating the arrangement of coplanar conductor paths 1, 2 in a passivation layer and on a substrate.

FIG. 3 illustrates the arrangement of an integrated coupling capacitor which, embedded into a passivation layer PASS, lies on an insulating substrate SUB (e.g. ESFI-SOS technology). The capacitance is produced by the coplanar conductor path arrangement 1-a-2. An arrangement of this type produces very high dielectric strengths which, using solid silicon technology, can otherwise only be achieved with great difficulty. On passivated surfaces the dielectric strength is in the region of several kV and the capacitance values are in the 100 pF-range.

ESFI-SOS technology is described in the brochure "Siemens Halbleiterbauelemente fur die Elektronik", order no. B 10/1431, pages 60 and 61, incorporated herein by reference.

Figure 4:
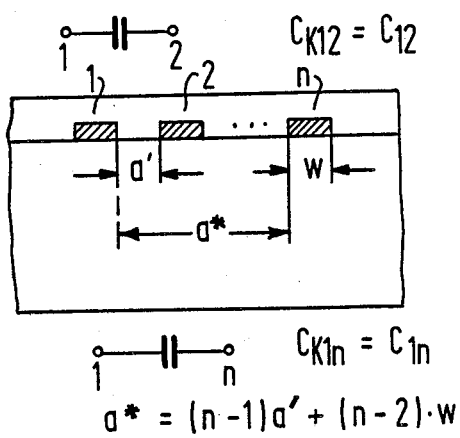
FIG. 4 is a cross-section through an arrangement corresponding to the invention of a plurality of coplanar conductor paths 1, 2 ... n.

Since, given small spacings d, the breakthrough field strength $E_{max}$ displays a sharp increase A (see FIG. 5) it can be advantageous to connect a plurality of coplanar capacitors (conductor paths) in series while simultaneously reducing the spacing thereby achieving high dielectric strengths and greater coupling capacitances (see FIG. 4). In this case the inner conductor paths (2 . . . n−1) do not carry a fixed potential. An increased dielectric strength of the multi-conductor arrangement is subject to dependent upon precise symmetrical design of the conductor paths which can be achieved relatively easily with current technology.

Figure 5:
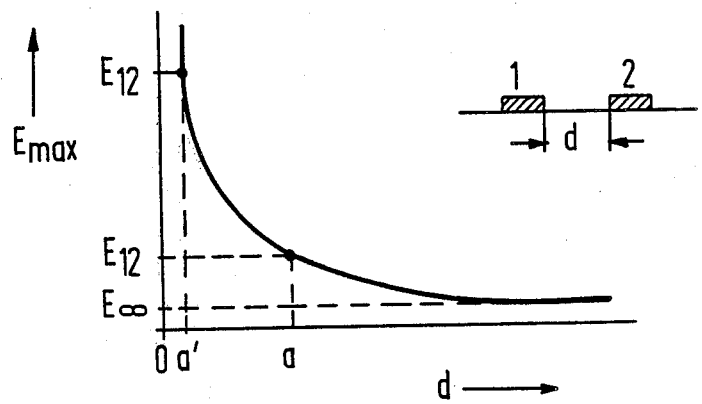
FIG. 5 illustrates the qualitative curve of the breakthrough field strength $E_{max}$ in dependence upon a spacing d between the conductor paths 1, 2.

In accordance with FIGS. 3, 4 and 5, the breakthrough voltage ($U_{DB}$) for two conductors and n conductors is governed by $$U_{DB12} \approx E_{12} \cdot a \quad (1)$$

and $$U_{DB1n} \approx nE_{12} \cdot a \quad (2)$$

In order to achieve an equal dielectric strength with n conductor paths we must have $$E_{12} \geq E_{12} \frac{a}{n a} \quad (3)$$

if $$C_{K1n} > C_{K12}$$

and $$a^* < a$$

A genuine gain can be achieved with respect to the quality ($U_{DB}$ and $C_K$) and area of the coupling capacitor.

In order to further increase the coupling capacitance, the passivation layer should possess as high as possible a relative dielectric constant.

Figure 6:
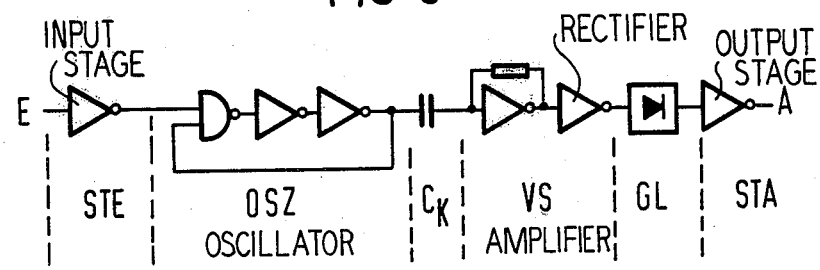
FIG. 6 is a gate circuit diagram of an integrated capacitive coupler designed in accordance with the invention.
Figure 7:
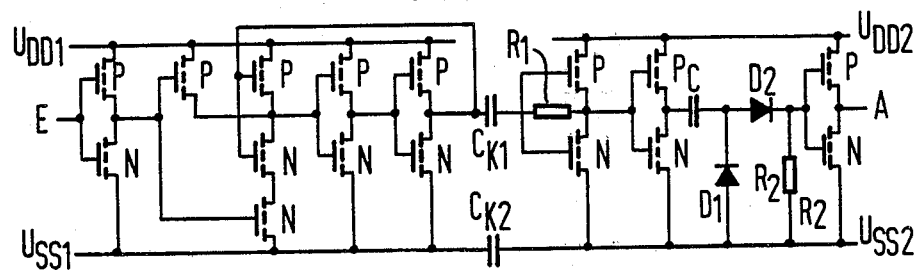
FIG. 7 is a detailed circuit diagram forming part of the gate circuit diagram shown in FIG. 6 of an integrated capacitive coupler constructed in accordance with the invention.

FIGS. 6 and 7 illustrate an example of a capacitive coupling circuit constructed for signal transmission in ESFI-SOS technology. The circuit elements are conventional transistors, diodes, resistors and capacitors (with the exception of $C_K$), as are used in ESFI technology. As a transmission path of this type displays band-pass characteristics, it is effective to tune the oscillator frequency to the middle frequency. This can be achieved by virtue of the selection of the number of stages in the ring oscillator OSZ or by modifying the inverter transit time. In this arrangement the input and output stage are referenced STE and STA respectively, the amplifier is referenced VS, and the rectifier is referenced GL.

The oscillator comprises a ring oscillator of a logic-linking element and at least one inverter connected to an output of the logic-linking element. The number of inverters being selected so as to determine the oscillating frequency of the oscillator. The oscillator frequency may also be determined by the transit time of the inverter.

Figure 8:
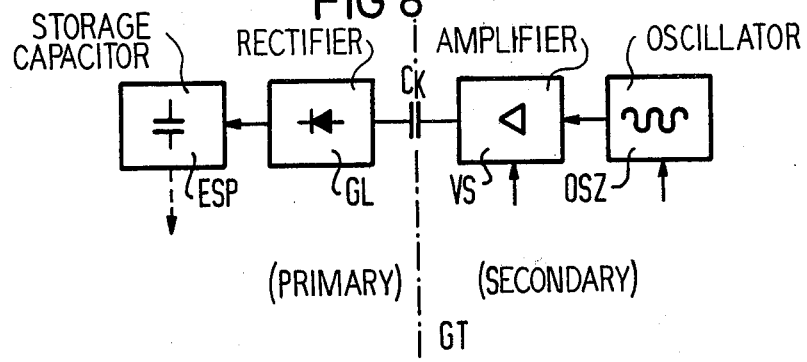
FIG. 8 is a block circuit diagram of an integrated capacitive coupler for power transmission constructed in accordance with the invention.
Figure 9:
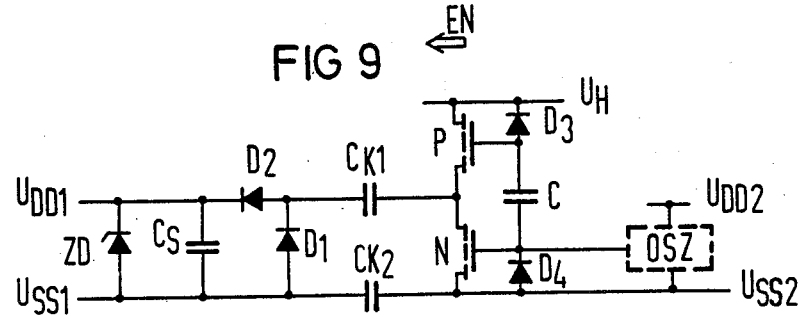
FIG. 9 is a detailed circuit diagram of the coupler illustrated in FIG. 8.

FIGS. 8 and 9 illustrate an example of a power supply circuit as the power coupler EK and consisting of a capacitive coupler. The voltage component U+1 of an oscillator signal of high frequency ($f_{osc}$) is amplified and the oscillator signal is transmitted via $C_K$ to the primary side. Here a current of the value $U_H \cdot 2 f_{osc} \cdot C_K$ flows. The current is rectified and the storage capacitor ESP is charged as a power store. The stored energy is adequate to temporarily supply the primary circuit with current in the form of short duration pulses.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A monolithically integrated circuit of high dielectric strength for electrically coupling isolated circuits having a high voltage difference therebetween, comprising: a signal coupler integrated on a chip; a primary circuit on the chip creating a signal; a secondary circuit on the chip to be coupled to receive the signal of the primary circuit, a high voltage difference being present between the primary and secondary circuits; the signal coupler having an integrated coupling capacitor formed of a coplanar arrangement of more than two spaced conductor paths embedded into a passivation layer, the passivation layer being arranged on an insulating substrate, and the signal coupler having a high dielectric strength of several kV; and the coupling capacitor comprising a plurality of coupling sub-capacitors formed of coplanar conductor path arrangements positioned on the chip, the coupling sub-capacitors being commonly interconnected in a series arrangement to form a capacitive voltage divider, and spacings between the conductor paths being reduced in comparison to spacings between conductor paths in the case of a coupling capacitor of a single coplanar conductor path arrangement.

2. The circuit of claim 1 wherein the insulating substrate comprises sapphire and the signal coupler has a dielectric strength of at least 1.5 kV.

3. A monolithically integrated circuit of claim 1 further including a signal input arranged to be influenced from outside of the chip and a signal output arranged to influence circuits external to the chip, the primary circuit having oscillator means for emitting an AC signal when it receives a relevant signal via the signal input, the secondary circuit having an amplifier and a rectifier between an output of the amplifier and the signal output, means for input coupling AC signals emitted from the oscillator via the coupling capacitor into an input of the amplifier such that a signal corresponding to the signal supplied to the signal input can be obtained from the signal output.

4. A monolithically integrated circuit of claim 3 wherein the oscillator means oscillates at a predetermined frequency which is a middle frequency of the overall circuit having band-pass characteristics.

5. A monolithically integrated circuit of claim 4 wherein the oscillator means comprises a ring oscillator of a logic-linking element and at least one inverter connected to an output of the logic-linking element, the number of inverters being selected so as to determine the oscillating frequency of the oscillator.

6. A monolithically integrated circuit of claim 4 wherein the oscillator has a ring oscillator and comprises a logic linking element and at least one inverter which is connected to an output of the logic-linking element, a transit time of the inverter being selected so as to determine the oscillating frequency of the oscillator.

7. A monolithically integrated circuit of claim 1 further including power coupler means for power supply of the primary circuit from a secondary voltage source, said power coupler means being arranged on the chip and designed substantially the same as the signal coupler, said power coupler means including at least one oscillator at its input end and at least one rectifier at its output end.

8. A monolithically integrated circuit of claim 7 wherein the output signal of the oscillator is connected for amplification by an amplifier and the rectifier is followed by a power store means from which short-duration pulses can be taken for power supply of the primary circuit.

9. The circuit of claim 8 wherein the power store means comprises a storage capacitor.

10. A monolithically integrated circuit of high dielectric strength for electrically coupling isolated circuits having a high voltage difference therebetween, comprising: a primary circuit and a secondary circuit integrated on a chip having said high voltage difference therebetween; a signal coupler connected to couple signals between the primary and secondary circuits; said signal coupler comprising more than two parallel conductor paths embedded in a passivation layer on an insulating substrate so as to form at least two series connected integrated coupling capacitors which can withstand said high voltage difference.

11. The circuit of claim 1 wherein the signal coupler can withstand a voltage difference of several kV.

* * * * *